(12) United States Patent
Yang et al.

(10) Patent No.: US 10,481,730 B2
(45) Date of Patent: Nov. 19, 2019

(54) DRIVING METHOD AND DRIVING CIRCUIT OF TOUCH CONTROL MODULE, TOUCH CONTROL MODULE, TOUCH CONTROL PANEL AND TOUCH CONTROL DEVICE

(71) Applicants: Boe Technology Group Co., Ltd., Beijing (CN); Beijing Boe Optoelectronics Technology Co., Ltd., Beijing (CN)

(72) Inventors: Shengji Yang, Beijing (CN); Xue Dong, Beijing (CN); Haisheng Wang, Beijing (CN); Xiaochuan Chen, Beijing (CN); Weijie Zhao, Beijing (CN); Yingming Liu, Beijing (CN); Xiaoliang Ding, Beijing (CN); Changfeng Li, Beijing (CN); Wei Liu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 22 days.

(21) Appl. No.: 15/038,187

(22) PCT Filed: Nov. 11, 2015

(86) PCT No.: PCT/CN2015/094303
§ 371 (c)(1),
(2) Date: May 20, 2016

(87) PCT Pub. No.: WO2016/197532
PCT Pub. Date: Dec. 15, 2016

(65) Prior Publication Data
US 2017/0168646 A1    Jun. 15, 2017

(30) Foreign Application Priority Data
Jun. 11, 2015    (CN) .......................... 2015 1 0320690

(51) Int. Cl.
*G06F 3/041* (2006.01)
*G06F 3/044* (2006.01)
(Continued)

(52) U.S. Cl.
CPC ............ *G06F 3/0418* (2013.01); *G06F 3/044* (2013.01); *G06F 3/047* (2013.01); *G06F 3/0412* (2013.01);
(Continued)

(58) Field of Classification Search
CPC ...... G06F 3/044; G06F 3/0412; G06F 3/0416; G09G 2300/0426; G09G 3/3258;
(Continued)

(56) References Cited

U.S. PATENT DOCUMENTS 8,890,850 B2 * 11/2014 Chung .................. G06F 3/0412
                                                    345/156
2005/0007353 A1 * 1/2005 Smith ................... G09G 3/3233
                                                    345/204
(Continued)

FOREIGN PATENT DOCUMENTS

CN    102708819        10/2012
CN    102708819 A      10/2012
(Continued)

OTHER PUBLICATIONS

First Office Action for Chinese Patent Application No. CN201510320690.3 dated May 4, 2017.
(Continued)

*Primary Examiner* — Sanjiv D. Patel
(74) *Attorney, Agent, or Firm* — Calfee, Halter & Griswold LLP

(57) ABSTRACT

The present disclosure provides a driving method of a touch control module, a drive circuit of a touch control module, a touch control module, a touch control panel and a touch control device. The driving method comprises: in a touch control time period, providing touch control scan signals to each of the plurality of touch control electrodes, and meanwhile providing respective touch control scan signals to control lines and data lines connected with each of the plurality of pixel driving circuits. Since the touch control electrodes and the pixel driving circuits are provided with touch control scan signals synchronously, the influence of other capacitances except for the touch control sensors to the touch control electrodes during touch control scan period can be released or even eliminated.

15 Claims, 4 Drawing Sheets

(51) Int. Cl.
  *G06F 3/047* (2006.01)
  *H01L 27/32* (2006.01)
  *G09G 3/3233* (2016.01)
(52) U.S. Cl.
  CPC ......... *G09G 3/3233* (2013.01); *H01L 27/323* (2013.01); *H01L 27/3262* (2013.01); *H01L 27/3276* (2013.01); *G09G 2300/0819* (2013.01); *G09G 2300/0842* (2013.01); *G09G 2300/0861* (2013.01); *G09G 2310/08* (2013.01); *G09G 2320/0219* (2013.01); *G09G 2354/00* (2013.01)
(58) Field of Classification Search
  CPC ...... G09G 3/32; G09G 3/3208; G09G 3/3291; H01L 27/323; H01L 27/3276; H01L 51/5012

See application file for complete search history.

(56) References Cited

U.S. PATENT DOCUMENTS

| | | | | |
|---|---|---|---|---|
| 2011/0001711 | A1* | 1/2011 | Choi | G06F 3/0412 345/173 |
| 2013/0293499 | A1* | 11/2013 | Chang | G06F 3/041 345/173 |
| 2014/0118231 | A1* | 5/2014 | Yang | G09G 3/3258 345/82 |
| 2016/0063922 | A1* | 3/2016 | Tsai | G09G 3/3233 345/76 |
| 2016/0240142 | A1* | 8/2016 | Jeong | G09G 3/3233 |
| 2016/0370919 | A1 | 12/2016 | Xu et al. | |
| 2017/0090644 | A1* | 3/2017 | Yao | G06F 3/0416 |
| 2017/0168619 | A1* | 6/2017 | Yang | G06F 3/0412 |

FOREIGN PATENT DOCUMENTS

| | | |
|---|---|---|
| CN | 102841718 | 12/2012 |
| CN | 102841718 A | 12/2012 |
| CN | 103093721 | 5/2013 |
| CN | 103236238 | 8/2013 |
| CN | 103236238 A | 8/2013 |
| CN | 103971638 | 8/2014 |
| CN | 104536632 A | 4/2015 |
| CN | 104850270 | 8/2015 |
| WO | 2013/012216 | 1/2013 |
| WO | 2013012216 A2 | 1/2013 |

OTHER PUBLICATIONS

International Search Report and Written Opinion from PCT/CN2015/094303 dated Mar. 15, 2016.

\* cited by examiner

DRIVING METHOD AND DRIVING CIRCUIT OF TOUCH CONTROL MODULE, TOUCH CONTROL MODULE, TOUCH CONTROL PANEL AND TOUCH CONTROL DEVICE

RELATED APPLICATIONS

The present application is the U.S. national phase entry of PCT/CN2015/094303, with an international filing date of Nov. 11, 2015, which claims the benefit of Chinese Patent Application No. 201510320690.3, filed on Jun. 11, 2015, the entire disclosures of which are incorporated herein by reference.

FIELD

The present disclosure relates to the field of touch control technology, particularly to a driving method and a driving circuit of touch control module, a touch control module, a touch control panel, and a touch control device.

BACKGROUND

The organic light emitting display is one of the hotspots in the research field of flat panel display nowadays. Compared with the liquid crystal display, the organic light emitting diode (OLED) has the advantages of low power consumption, low production cost, self-illumination, wide visual angle, high response speed, etc. At present, in the display fields of mobile phone, personal digital assistant (PDA), digital camera, the OLED has begun to replace the conventional liquid crystal display (LCD) screen.

The existing built-in self-capacitive active-matrix organic light emitting diode (AMOLED) touch control display module is driven by using the manner of time division, i.e., performing pixel display driving in the display time period, performing touch control scanning in the touch control time period. However, in the touch control time period, the touch control electrodes comprised in the built-in self-capacitive AMOLED touch control display module will be influenced by other capacitances in the circuit, thereby influencing the touch control accuracy.

SUMMARY

The present disclosure provides a driving method for a touch control module, a driving circuit of a touch control module, a touch control module, a touch control panel and a touch control device, which can release and/or eliminate influence of other capacitances except for the touch control sensors to the touch control electrodes during the touch control scan period.

According to an aspect of the present disclosure, a method for driving a self-capacitive AMOLED touch control module is provided, the self-capacitive AMOLED touch control module comprising a plurality of touch control electrodes and a plurality of pixel driving circuits, the method comprising: in a touch control time period, providing touch control scan signals to each of the plurality of touch control electrodes, and meanwhile providing respective touch control scan signals to control lines and data lines connected with each of the plurality of pixel driving circuits.

Optionally, the self-capacitive AMOLED touch control module is a built-in touch control module, wherein a plurality of cathode electrodes arranged corresponding to a plurality of pixel units are multiplexed as the plurality of touch control electrodes.

Optionally, the respective touch control scan signals provided to the control lines and the data lines connected with each pixel driving circuit have such amplitude values that transistors in the pixel driving circuits maintain operation states which they have before entering the touch control time period.

Optionally, the respective touch control scan signals provided to the control lines and the data lines connected with each pixel driving circuit are superimposition of touch control scan signals provided to the touch control electrodes and respective display driving signals provided to the control lines and the data lines before entering into the touch control time period.

Optionally, providing touch control scan signals to the touch control electrodes comprises: providing touch control scan signals to the touch control electrodes through a gate metal layer comprised in the self-capacitive AMOLED touch control module.

According to another aspect of the present disclosure, a driving circuit of a self-capacitive AMOLED touch control module is provided, the self-capacitive AMOLED touch control module comprising a plurality of touch control electrodes and a plurality of pixel driving circuits, the driving circuit comprises: a touch control driving unit configured to, in the touch control time period, provide touch control scan signals to each of the plurality of touch control electrodes, and meanwhile provide respective touch control scan signals to control lines and data lines connected with each of the plurality of pixel driving circuits.

Optionally, the self-capacitive AMOLED touch control module is a built-in touch control module, wherein a plurality of cathode electrodes arranged corresponding to a plurality of pixel units are multiplexed as the plurality of touch control electrodes.

Optionally, the respective touch control scan signals provided by the touch control driving unit to the control lines and the data lines connected with each pixel driving circuit have such amplitude values that transistors in the pixel driving circuits maintain operation states which they have before entering the touch control time period.

Optionally, the respective touch control scan signals provided to the control lines and the data lines connected with each pixel driving circuit are superimposition of touch control scan signals provided to the touch control electrodes and respective display driving signals provided to the control lines and the data lines before entering into the touch control time period.

Optionally, the self-capacitive AMOLED touch control module comprises a gate metal layer, wherein the touch control driving unit provides touch control scan signals to the touch control electrodes through the gate metal layer.

Optionally, each of the plurality of pixel driving circuits comprises a drive transistor, a storage capacitor, a reset module, a charge control module and a light emitting control module, wherein the gate of the drive transistor is connected to the reset module, the charge control module and the first end of the storage capacitor, the first terminal of the drive transistor is connected to the light emitting control module and the charge control module, the second terminal of the drive transistor is connected to the light emitting control module and the charge control module; the first end of the storage capacitor is connected to the gate of the drive transistor, the second end of the storage capacitor is connected to a first level line; the reset module is connected to a first scan line and a common electrode line; the charge control module is connected to a second scan line and a data line; and the light emitting control module is connected to a light emitting control line, the first level line and an anode of an organic light emitting diode; and wherein the touch control driving unit provides respective touch control scan signals to the data line, the first scan line, the common electrode line, the light emitting control line, the second scan line and the first level line in the touch control time period.

Optionally, the reset module comprises a reset transistor, the gate of the reset transistor being connected with the first scan line, the first terminal of the reset transistor being connected with the gate of the drive transistor and the first end of the storage capacitor, the second terminal of the reset transistor being connected with the common electrode line.

Optionally, the charge control module comprises: a data input transistor, the gate of the data input transistor being connected with the second scan line, the first terminal of the data input transistor being connected with the data line, the second terminal of the data input transistor being connected with the second terminal of the drive transistor; and a charge control transistor, the gate of the charge control transistor being connected with the second scan line, the first terminal of the charge control transistor being connected with the gate of the drive transistor, the second terminal of the charge control transistor being connected with the first terminal of the drive transistor.

Optionally, the light emitting control module comprises: a first light emitting control transistor, the gate of the first light emitting control transistor being connected with the light emitting control line, the first terminal of the first light emitting control transistor being connected with the first level line, the second terminal of the first light emitting control transistor being connected with the first terminal of the drive transistor; and a second light emitting control transistor, the gate of the second light emitting control transistor being connected with the light emitting control line, the first terminal of the second light emitting control transistor being connected with the second terminal of the drive transistor, the second terminal of the second light emitting control transistor being connected with the anode of the organic light emitting diode.

According to a further aspect of the present disclosure, a touch control module is provided, comprising the driving circuit of a touch control module as described above.

According to yet another aspect of the present disclosure, a touch control panel is provided, comprising the touch control module as described above.

According to yet a further aspect of the present disclosure, a touch control device is provided, comprising the touch control panel as described above.

The present disclosure has the following effect: since the touch control electrodes and the pixel driving circuits are provided with touch control scan signals synchronously, the influence of other capacitances (e.g., parasitic capacitance) except for the touch control sensors to the touch control electrodes during touch control scan period can be released or even eliminated.

DETAILED DESCRIPTION

Next, the technical solutions in the embodiments of the present disclosure will be described clearly and completely in combination with the drawings in the embodiments of the present disclosure, the embodiments described are only a part of rather than all of the embodiments of the present disclosure. Based on the embodiments in the present disclosure, other embodiments conceived by the ordinary skilled person in the art without undue experimentation belong to the protection scope of the present disclosure.

Figure 1:
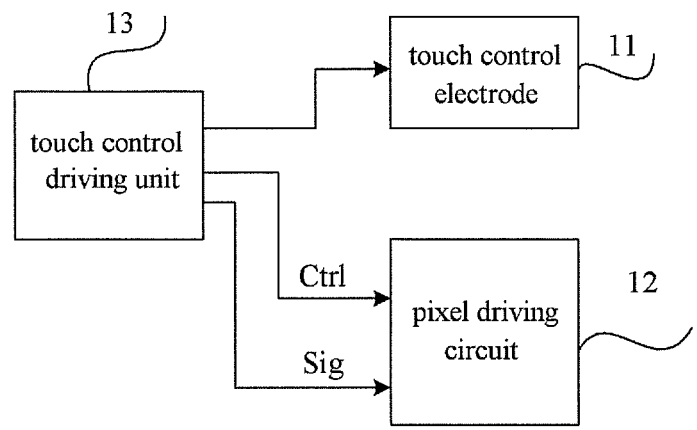
FIG. 1 is a block diagram of structure of a driving circuit of a touch control module according to an embodiment of the present disclosure.

FIG. 1 is a block diagram of structure of a driving circuit of a touch control module according to an embodiment of the present disclosure. The touch control module can be a self-capacitive AMOLED touch control module, comprising a plurality of touch control electrodes 11 (only one of them is shown in FIG. 1) and a plurality of pixel driving circuits 12 (only one of them is shown in FIG. 1). Each of the plurality of pixel driving circuits 12 corresponds to one pixel unit in the AMOLED touch control module. In operation, the AMOLED touch control module is driven in the manner of time division. In the display time period, normal display driving signals are provided to control lines Ctrl (only one of them is shown in FIG. 1) and data lines Sig connected with the pixel driving circuits 12 so as to control the light emitting state of each pixel unit. In the touch control time period, the touch control scan signals are provided to the control lines Ctrl and the data lines Sig connected with the pixel driving circuits 12 at the same time of providing the touch control scan signals to the touch control electrodes 11. Since the touch control electrodes 11 and the pixel driving circuits 12 are provided with the touch control scan signals synchronously, the influence of possible parasitic capacitances in the pixel driving circuits 12 to the touch control electrodes can be avoided.

In some embodiments, the driving circuit comprises a touch control driving unit 13. As described above, the touch control driving unit 13 provides normal display driving signals to the control lines Ctrl and the data lines Sig connected with the pixel driving circuits 12 in the display time period, and provides touch control scan signals to the touch control electrodes 11 in the touch control time period and meanwhile provides the touch control scan signals to the control lines Ctrl and the data lines Sig connected with the pixel driving circuits 12. Further, in the touch control time period, the touch control driving unit 13 provides touch control scan signals with such amplitude values that the transistors in the pixel driving circuits 12 maintain operation states which they have before entering the touch control time period (for example, ON or OFF). In one embodiment, the respective touch control scan signals provided to the control lines Ctrl and the data lines Sig connected with each pixel driving circuit 12 by the touch control driving unit 13 are superimposition of touch control scan signals provided to the touch control electrodes 11 and respective display driving signals provided to the control lines and the data lines before entering into the touch control time period (which will be discussed below). In this way, the synchronous driving operations in the touch control time period can have no influence to the light emission of the OLED, so as to ensure that the light emitting state of the OLED is consistent with the state in the display time period.

In one embodiment, the self-capacitive AMOLED touch control module is a built-in touch control module, wherein a plurality of cathode electrodes arranged corresponding to a plurality of pixel units are multiplexed as the plurality of touch control electrodes. Specifically, the original whole layer of cathode electrodes are divided into a plurality of block shaped cathode electrodes corresponding to a plurality of pixel units, and each block shaped cathode electrode serves as a touch control electrode in the touch control time period. Further, the gate metal layer below the thin film transistor (TFT) area in the AMOLED touch control module can serve as a metal conductive layer, so as to transmit touch control scan signals to the plurality of block shaped cathode electrodes in the touch control time period. For example, the gate metal layer can be used to form a metal wiring for transmitting the touch control scan signals.

Figure 2:
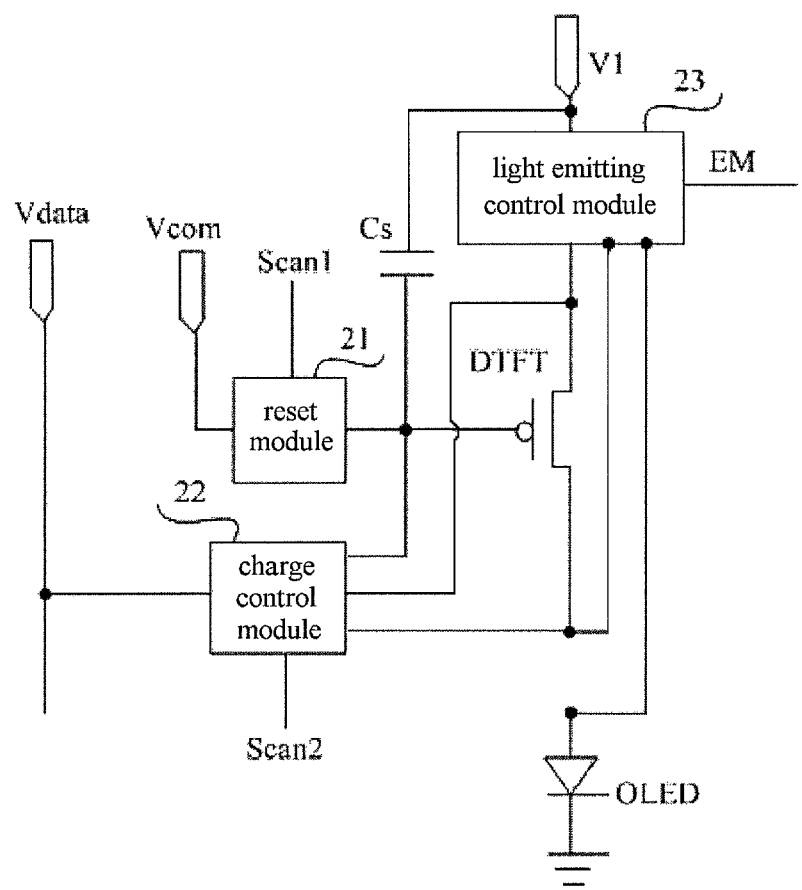
FIG. 2 is a high level structure diagram of a pixel driving circuit comprised in a driving circuit of a touch control module according to an embodiment of the present disclosure.

FIG. 2 is a high level structure diagram of a pixel driving circuit comprised in a driving circuit of a touch control module according to an embodiment of the present disclosure. As shown in FIG. 2, each pixel driving circuit comprises a drive transistor DTFT, a storage capacitor Cs, a reset module 21, a charge control module 22 and a light emitting control module 23.

The gate of the drive transistor DTFT is connected to the reset module 21, the charge control module 22 and the first end of the storage capacitor Cs. The first terminal of the drive transistor DTFT is connected to the light emitting control module 23 and the charge control module 22, and the second terminal of the drive transistor DTFT is connected to the light emitting control module 23 and the charge control module 22.

The first end of the storage capacitor Cs is connected to the gate of the drive transistor DTFT, and the second end the storage capacitor Cs is connected to a first level line for transmitting a first level V1.

The reset module 21 is connected to a first scan line Scan1 and a common electrode line for transmitting a common electrode voltage Vcom. In a first phase of each display time period, the reset module 21, under the control of a reset control signal on the first scan line Scan1, resets the gate voltage of the drive transistor DTFT as the common electrode voltage Vcom on the common electrode line, so as to control the drive transistor DTFT to be off.

The charge control module 22 is connected to a second scan line Scan2 and a data line for transmitting a data voltage Vdata. In a second phase of each display time period, the charge control module 22, under the control of the scan signal on the second scan line Scan2, connects the first terminal of the drive transistor DTFT to the gate of the drive transistor DTFT, and provides the data voltage Vdata on the data line to the second terminal of the drive transistor DTFT, so as to control the drive transistor DTFT to be on, thereby charging the storage capacitor Cs with the data voltage Vdata until the potential of the gate of the drive transistor DTFT is Vdata-Vth, wherein Vth is the threshold voltage of the drive transistor DTFT. In a third phase of each display time period, the charge control module 22 disconnects the first terminal of the drive transistor DTFT and the gate of the drive transistor DTFT, and disconnects of the second terminal of the drive transistor DTFT and the data line.

The light emitting control module 23 is connected to a light emitting control line EM for transmitting the light emitting control signal, the first level line for transmitting the first level V1 and an anode of an organic light emitting diode OLED. In the third phase of each display time period, the light emitting control module 23, under the control of the light emitting control signal on the light emitting control line EM, provides the first level V1 on the first level line to the first terminal of the drive transistor DTFT, and connects the second terminal of the drive transistor DTFT to the anode of the organic light emitting diode OLED, thereby controlling the drive transistor DTFT to drive the organic light emitting diode OLED to emit light.

As described above, during the touch control time period, the touch control driving unit 13 (not shown in FIG. 2) provides touch control scan signals to the data line for transmitting the data voltage Vdata, the second scan line Scan2, the common electrode line for transmitting the common electrode voltage Vcom, the light emitting control line EM, the first scan line Scan1 and the first level line for transmitting the first level V1 while outputting the touch control scan signals to the touch control electrodes (e.g., the cathode electrodes of the OLED).

Figure 3:
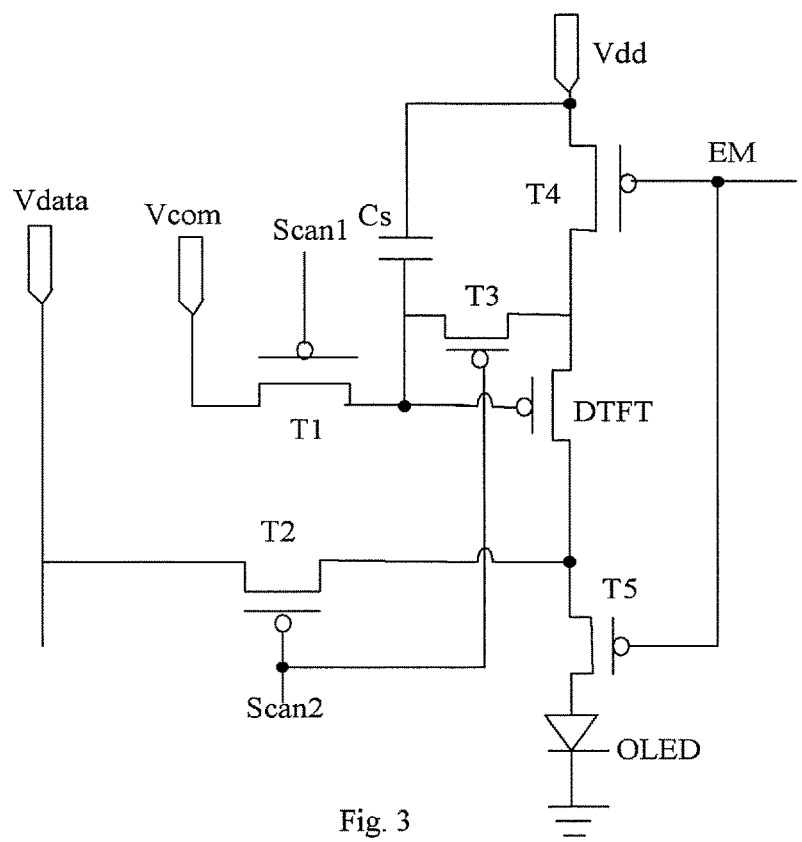
FIG. 3 is a circuit diagram of a pixel driving circuit comprised in a driving circuit of a touch control module according to an embodiment of the present disclosure.

FIG. 3 is a circuit diagram of a pixel driving circuit comprised in a driving circuit of a touch control module according to an embodiment of the present disclosure. Referring to FIG. 3 in combination with FIG. 2, the reset module 21 comprises a reset transistor T1. The gate of the reset transistor T1 is connected with the first scan line Scan1. The source of the reset transistor is connected with the gate of the drive transistor DTFT and the first end of the storage capacitor Cs, and the drain of the reset transistor is connected with the common electrode line for transmitting the common electrode voltage Vcom.

The charge control module 22 comprises a data input transistor T2 and a charge control transistor T3. The gate of the data input transistor T2 is connected with the second scan line Scan2. The source of a data input transistor T2 is connected with the data line for transmitting the data voltage Vdata, and the drain of a data input transistor T2 is connected with the drain of the drive transistor DTFT. The gate of the charge control transistor T3 is connected with the second scan line Scan2. The source of the charge control transistor T3 is connected with the gate of the drive transistor DTFT, and the drain of the charge control transistor T3 is connected with the source of the drive transistor DTFT.

The light emitting control module 23 comprises a first light emitting control transistor T4 and a second light emitting control transistor T5. The gate of the first light emitting control transistor T4 is connected with the light emitting control line EM. The source of the first light emitting control transistor T4 is connected with a high level line for transmitting a high level Vdd, and the drain of the first light emitting control transistor T4 is connected with the source of the drive transistor DTFT. The gate of the second light emitting transistor T5 is connected with the light emitting control line EM. The source of the second light emitting transistor T5 is connected with the drain of the drive transistor DTFT, the drain of the second light emitting transistor T5 is connected with the anode of the organic light emitting diode OLED.

In the example as shown in FIG. 3, all transistors are p-type TFTs. However, in other embodiments, n-type transistors can be used, or some of the transistors are in the form of the p-type transistors while the others are in the form of the n-type transistors. The transistors can be thin film transistors, field effect transistors or other devices with the same characteristics. When they are used as switch devices, the source and the drain of the transistors can be interchanged generally. In embodiments of the present disclosure, in order to make a distinction, the source or the drain can be called the first terminal, and the corresponding drain or the corresponding source is called the second terminal.

Figure 4:
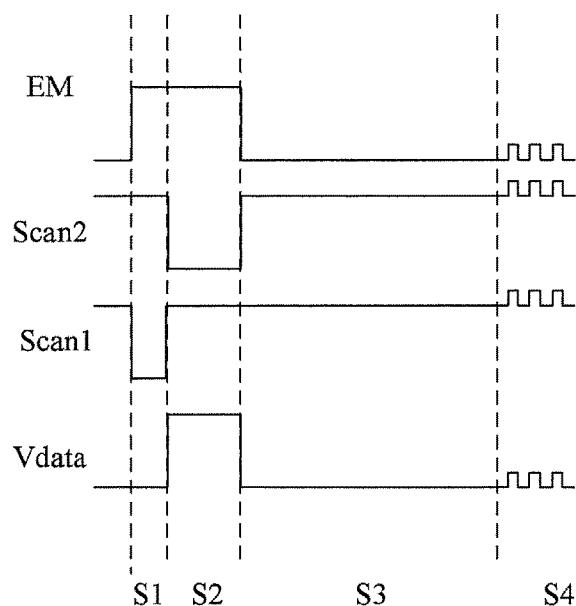
FIG. 4 is a working sequence diagram of the pixel driving circuit as shown in FIG. 3.

FIG. 4 is a working sequence diagram of the pixel driving circuit as shown in FIG. 3. In FIG. 4, S1 represents a first phase (a reset phase) of each display time period, S2 represents a second phase (a charging phase) of each display time period, S3 represents a third phase (a light emitting phase) of each display time period, and S4 represents a touch control time period. Particularly, as described above, the respective touch control scan signals provided to the control lines and the data lines connected with each pixel driving circuit in the touch control time period S4 are superimposition of touch control scan signals (indicated by square waves in FIG. 4) provided to the touch control electrodes and respective display driving signals (e.g., EM, Scan2, Scan1, Vdata etc.) provided to the control lines and the data lines before entering the touch control time period.

FIG. 5A to FIG. 5D are working state diagrams of the pixel driving circuit as shown in FIG. 3 in different time periods, wherein the broken line circle represents Off state of the corresponding transistor.

Figure 5A:
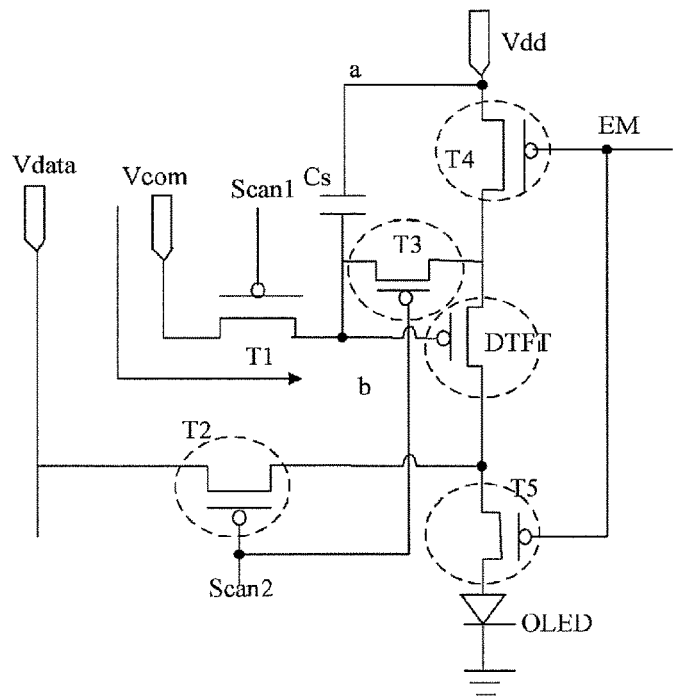
FIG. 5A is a working state diagram of the pixel driving circuit as shown in FIG. 3 in a first phase S1 of a display time period.

As shown in FIG. 5A, in the first phase (the reset phase) S1 of each display time period, T1 is turned on, and T2, T3, T4 and T5 are turned off. Here, a node b (connected with the gate of the drive transistor DTFT) is reset to be at the common electrode voltage Vcom (here the Vcom is a low level signal).

Figure 5B:
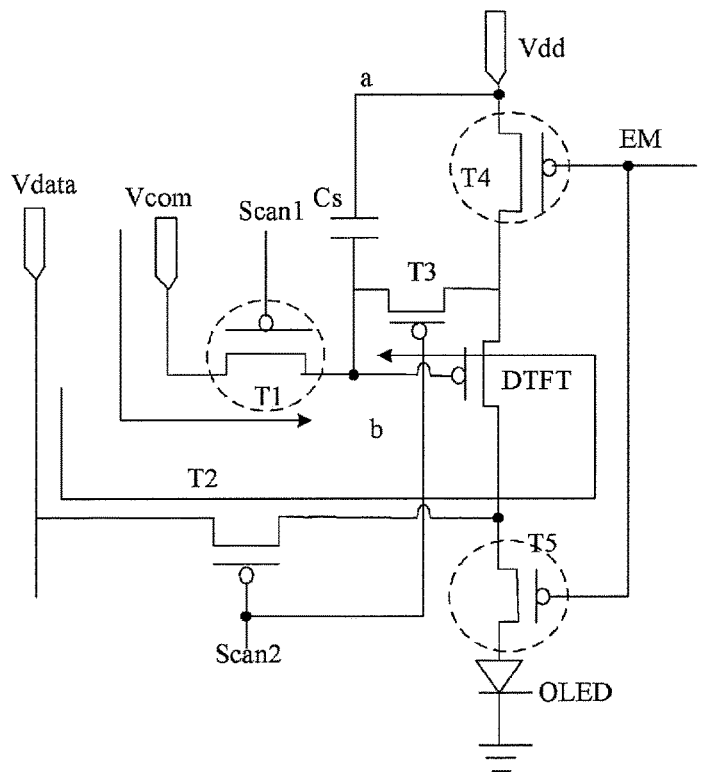
FIG. 5B is a working state diagram of the pixel driving circuit as shown in FIG. 3 in a second phase S2 of a display time period.

As shown in FIG. 5B, in the second phase (the charging phase) S2 of each display time period, T2 and T3 are turned on, and T1, T4 and T5 are turned off. Since the node b is at a low level Vcom previously, the drive transistor DTFT is turned on. The Vdata begins to charge the node b through T2, DTFT and T3 successively, until the potential of the node b is charged to Vdata-Vth (which meets the condition that the voltage difference between the gate and the source of the DTFT is the threshold voltage Vth of the DTFT). In this process, since the node a (the second end of the storage capacitor Cs) is at a high level Vdd all the time, after the charging is finished, the potential of the node b will be maintained at Vdata-Vth all along. In addition, since T5 is turned off, no current flows through the OLED, so that the life loss of the OLED is reduced.

Figure 5C:
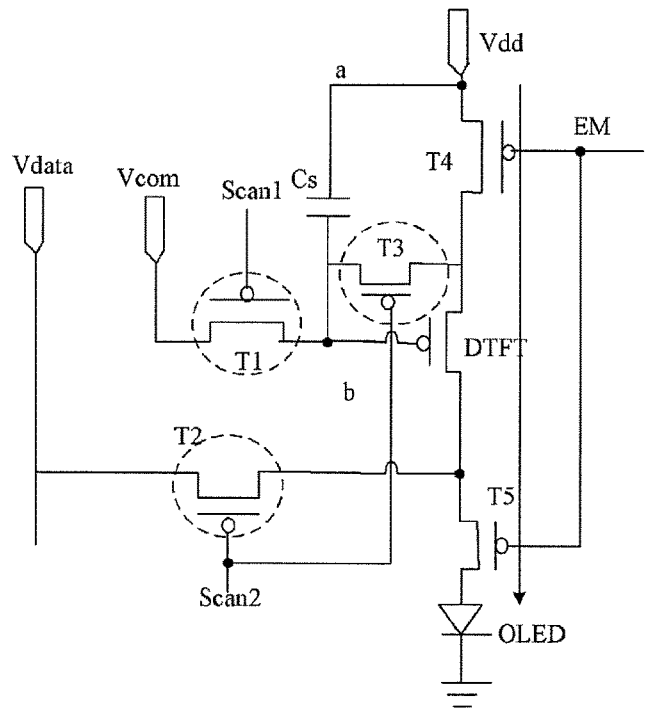
FIG. 5C is a working state diagram of the pixel driving circuit as shown in FIG. 3 in a third phase S3 of a display time period.

As shown in FIG. 5C, in the third phase (the light emitting phase) S3 of each display time period, i.e., the light emitting phase of the AMOLED pixel, the source of the DTFT is applied with Vdd, and the current flows through the OLED via T4, DTFT and T5 successively so as to enable it to start emitting light.

From the TFT saturated current formula it can be derived:

$$I_{OLED}=K\times(V_{GS}-Vth)^2=K\times[Vdd-(Vdata-Vth)-Vth]^2=K\times(Vdd-Vdata)^2,$$

wherein K is the current amplification coefficient of the DTFT; $V_{GS}$ is the gate-source voltage of the DTFT; and $I_{OLED}$ is the working current of the OLED.

From the above formula it can be seen that $I_{OLED}$ has been unaffected by Vth, while only being related to Vdd and Vdata. This has thoroughly solved the problem of threshold voltage shifts of the drive transistor DTFT due to the manufacturing process and the long time operation, thereby eliminating the influence of the characteristics of the drive transistor DTFT to the $I_{OLED}$.

Figure 5D:
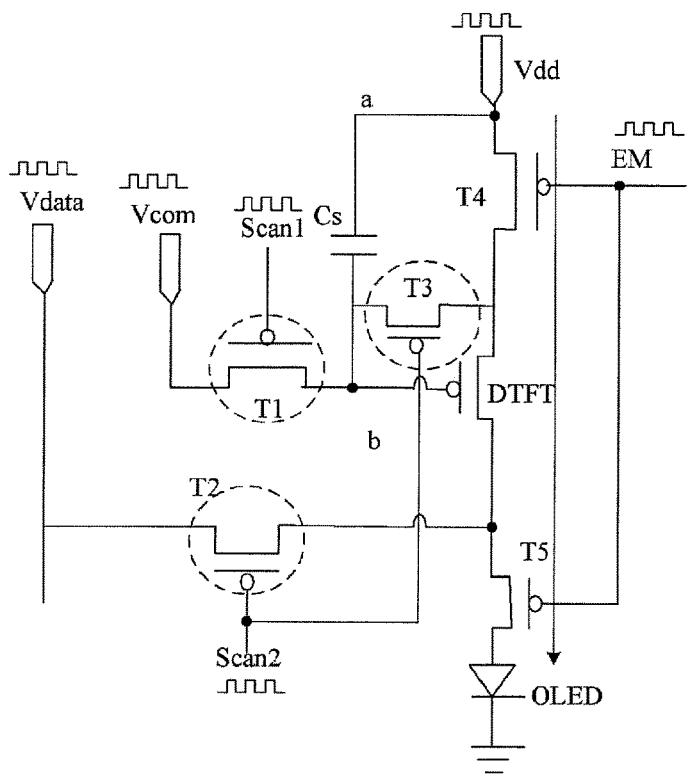
FIG. 5D is a working state diagram of the pixel driving circuit as shown in FIG. 3 in a touch control time period S4.

As shown in FIG. 5D, in the touch control time period S4, all the transistors in the pixel driving circuit maintain the original ON-OFF state (i.e., the state in the light emitting phase S3 of the display time period). As described above, in addition to the cathode electrodes (the touch control electrodes) of the OLED that are provided with the touch control scan signals, other control lines and data lines (the high level line for transmitting the high level Vdd, the data line for transmitting the data voltage Vdata, the first scan line Scan1, the second scan line Scan2 and the light emitting control line EM) are provided with respective touch control scan signals. Particularly, the respective touch control scan signals provided to the control lines and the data lines are superimposition of touch control scan signals (the square waves as shown in FIG. 5D) provided to the touch control electrodes and respective display driving signals provided to the control lines and the data lines before entering into the touch control time period. Since the signals on the control lines and the data lines change synchronously and the amplitude values of the original touch control scan signals are relatively small relative to the amplitude values of the display driving signals, all the transistors in the pixel driving circuits maintain the original ON-OFF state. In addition, because the node b is in the floating state, even if the Vdd voltage now hops with the original touch control signal, the potential of the node b will also hop with the potential of the node a. That is, the working current $I_{OLED}$ of the OLED is not affected.

According to a further aspect of the present disclosure, a touch control module is provided, comprising the above driving circuit.

According to yet another aspect of the present disclosure, a touch control panel is provided, comprising the above touch control module.

According to yet a further aspect of the present disclosure, a touch control device is provided, comprising the above touch control panel.

What are described herein are optional embodiments of the present disclosure. It should be noted that the ordinary skilled person in the art, without departing from the principle of the present disclosure, can also make some improvements and modifications. These improvements and modifications should also be considered to be within the scope of the present disclosure.

The invention claimed is:

1. A method for driving a self-capacitive AMOLED touch control module in a manner of time division, the self-capacitive AMOLED touch control module comprising:
   a plurality of touch control electrodes; and
   a plurality of pixel driving circuits, each of the plurality of pixel driving circuits corresponding to one pixel unit in the AMOLED touch control module;
   wherein the method comprises:
   in a display time period, performing pixel display driving so as to control the light emitting state of each pixel unit;
   in a touch control time period, providing a touch control scan signal to each of the plurality of touch control electrodes, and meanwhile providing the touch control scan signal to the control lines and data lines connected with each of the plurality of pixel driving circuits, the data lines being configured to transmit a data voltage;

wherein the touch control scan signal provided to the control lines and the data lines connected with each pixel driving circuit has such an amplitude value that transistors in the pixel driving circuits maintain operation states which they have before entering the touch control time period.

2. The method as claimed in claim 1, wherein the self-capacitive AMOLED touch control module is a built-in touch control module, and wherein a plurality of cathode electrodes arranged corresponding to a plurality of pixel units are multiplexed as the plurality of touch control electrodes.

3. The method as claimed in claim 1, wherein the touch control scan signal provided to the control lines and the data lines connected with each pixel driving circuit is superimposition of the touch control scan signal provided to the touch control electrodes and the display driving signal provided to the control lines and the data lines before entering into the touch control time period.

4. The method as claimed in claim 1, wherein providing touch control scan signals to the touch control electrodes comprises: providing touch control scan signals to the touch control electrodes through a gate metal layer comprised in the self-capacitive AMOLED touch control module.

5. A driving circuit of a self-capacitive AMOLED touch control module, the self-capacitive AMOLED touch control module being driven in a manner of time division and comprising a plurality of touch control electrodes and a plurality of pixel driving circuits, wherein each of the plurality of pixel driving circuits corresponds to one pixel unit in the AMOLED touch control module, and wherein the driving circuit comprises:

a touch control driving unit configured to:
in a display time period, perform pixel display driving so as to control the light emitting state of each pixel unit
in a touch control time period, provide a touch control scan signal to each of the plurality of touch control electrodes, and meanwhile provide the touch control scan signal to the control lines and data lines connected with each of the plurality of pixel driving circuits, the data lines being configured to transmit a data voltage;
wherein the touch control scan signal provided by the touch control driving unit to the control lines and the data lines connected with each pixel driving circuit has such an amplitude value that transistors in the pixel driving circuits maintain operation states which they have before entering the touch control time period.

6. The driving circuit of a touch control module as claimed in claim 5, wherein the self-capacitive AMOLED touch control module is a built-in touch control module, wherein a plurality of cathode electrodes arranged corresponding to a plurality of pixel units are multiplexed as the plurality of touch control electrodes.

7. The driving circuit of a touch control module as claimed in claim 5, wherein the touch control scan signal provided to the control lines and the data lines connected with each pixel driving circuit is superimposition of touch control scan signals provided to the touch control electrodes and the display driving signal provided to the control lines and the data lines before entering into the touch control time period.

8. The driving circuit of a touch control module as claimed in claim 5, the self-capacitive AMOLED touch control module comprising a gate metal layer, wherein the touch control driving unit provides touch control scan signals to the touch control electrodes through the gate metal layer.

9. The driving circuit of a touch control module as claimed in claim 5, each of the plurality of pixel driving circuits comprising a drive transistor, a storage capacitor, a reset module, a charge control module and a light emitting control module, wherein:

the gate of the drive transistor is connected to the reset module, the charge control module and the first end of the storage capacitor, the first terminal of the drive transistor is connected to the light emitting control module and the charge control module, the second terminal of the drive transistor is connected to the light emitting control module and the charge control module;

the first end of the storage capacitor is connected to the gate of the drive transistor, the second end of the storage capacitor is connected to a first level line;

the reset module is connected to a first scan line and a common electrode line;

the charge control module is connected to a second scan line and a data line; and the light emitting control module is connected to a light emitting control line, the first level line and an anode of an organic light emitting diode; and wherein the touch control driving unit provides the touch control scan signal to the data line, the first scan line, the common electrode line, the light emitting control line, the second scan line and the first level line in the touch control time period.

10. The driving circuit of a touch control module as claimed in claim 9, wherein the reset module comprises a reset transistor, the gate of the reset transistor being connected with the first scan line, the first terminal of the reset transistor being connected with the gate of the drive transistor and the first end of the storage capacitor, the second terminal of the reset transistor being connected with the common electrode line.

11. The driving circuit of a touch control module as claimed in claim 9, wherein the charge control module comprises:

a data input transistor, the gate of the data input transistor being connected with the second scan line, the first terminal of the data input transistor being connected with the data line, the second terminal of the data input transistor being connected with the second terminal of the drive transistor; and a charge control transistor, the gate of the charge control transistor being connected with the second scan line, the first terminal of the charge control transistor being connected with the gate of the drive transistor, the second terminal of the charge control transistor being connected with the first terminal of the drive transistor.

12. The driving circuit of a touch control module as claimed in claim 9, wherein the light emitting control module comprises:

a first light emitting control transistor, the gate of the first light emitting control transistor being connected with the light emitting control line, the first terminal of the first light emitting control transistor being connected with the first level line, the second terminal of the first light emitting control transistor being connected with the first terminal of the drive transistor; and a second light emitting control transistor, the gate of the second light emitting control transistor being connected with the light emitting control line, the first terminal of the second light emitting control transistor being connected with the second terminal of the drive transistor, the second terminal of the second light emitting control transistor being connected with the anode of the organic light emitting diode.

13. A touch control module, comprising the driving circuit of a touch control module as claimed in claim 5.

14. A touch control panel, comprising the touch control module as claimed in claim 13.

15. A touch control device, comprising a touch control panel as claimed in claim 14.

* * * * *